United States Patent [19]

Signorile

[11] Patent Number: 4,488,147

[45] Date of Patent: Dec. 11, 1984

[54] BATTERY JUMPER CABLE SYSTEM

[75] Inventor: Eugene R. Signorile, Chicago, Ill.

[73] Assignee: Telecopt Co., Chicago, Ill.

[21] Appl. No.: 358,022

[22] Filed: Mar. 15, 1982

[51] Int. Cl.³ ............................................. G08B 21/00
[52] U.S. Cl. .................................... 340/636; 320/48;
 324/133; 339/29 B
[58] Field of Search ........................ 340/636; 315/135;
 324/133, 51; 320/25, 26, 48; 307/130; 339/29 B

[56] References Cited

U.S. PATENT DOCUMENTS 3,259,754 7/1966 Matheson ............................. 324/133
4,272,142 6/1981 Zapf .................................... 324/133

Primary Examiner—James L. Rowland
Assistant Examiner—Daniel Myer
Attorney, Agent, or Firm—Lockwood, Alex, Fitzgibbon & Cummings

[57] ABSTRACT

A battery jumper cable system wherein an alarm is provided upon initial misconnection of the system cables to a first-connected battery, or upon subsequent misconnection of one of the system cables to a second-connected battery. The system includes principal conductors for connection to the terminal posts of the batteries, and an auxiliary conductor for connection to the frame or ground terminal of the second-connected battery. An alternative embodiment provides for two auxiliary conductors whereby either end of the cable system can be connected to either battery.

8 Claims, 15 Drawing Figures

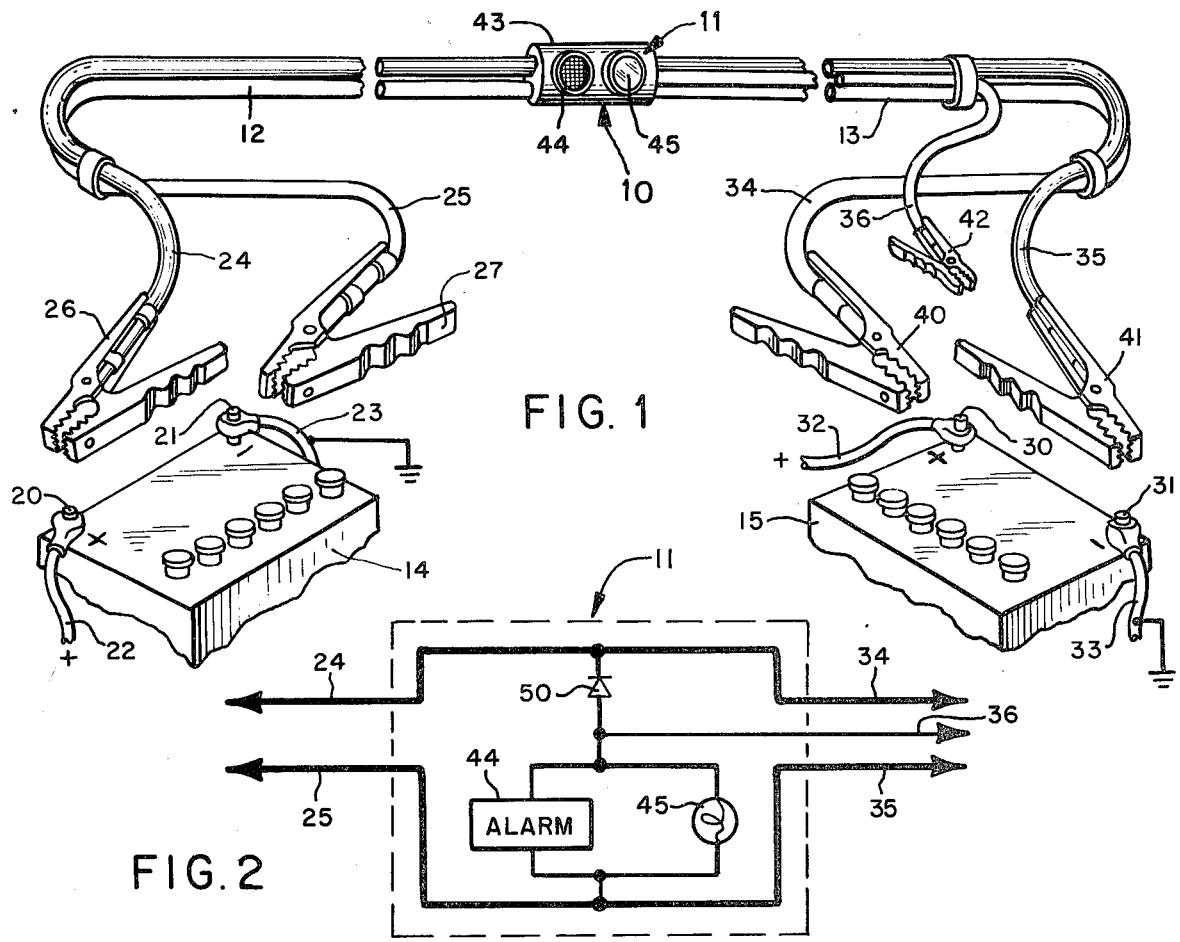
FIG. 1
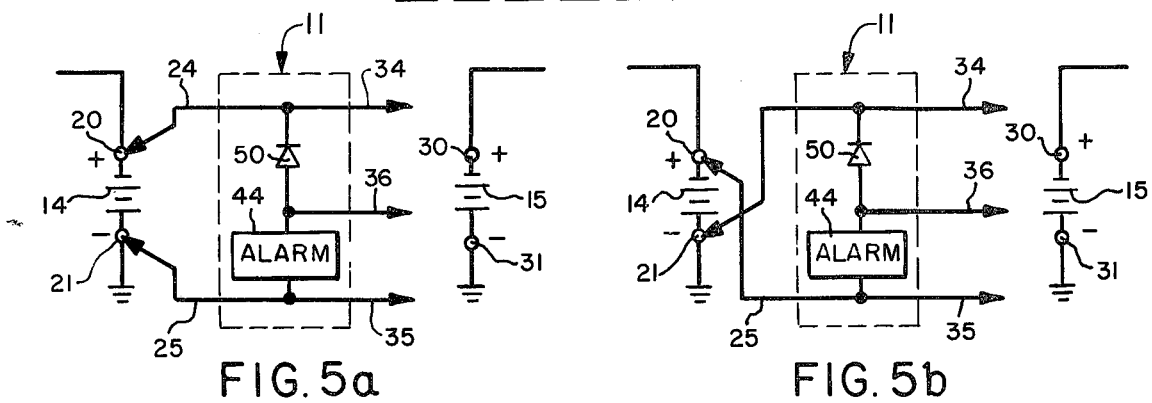
FIG. 2
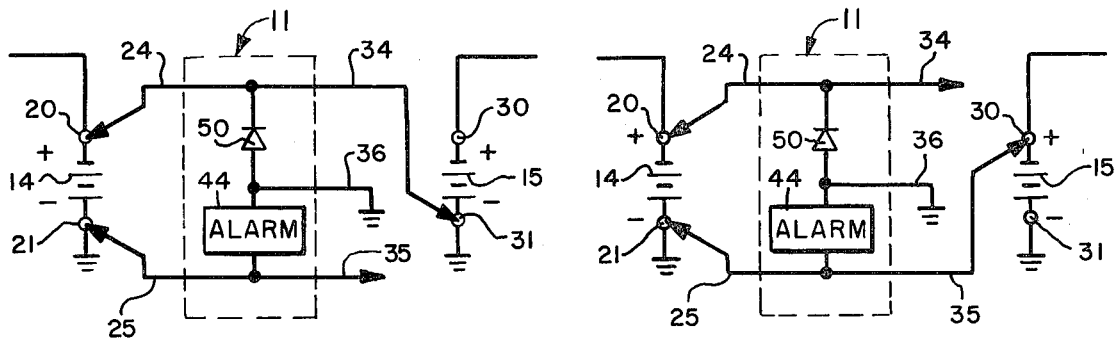
FIG. 5a FIG. 5b
FIG. 5c FIG. 5d

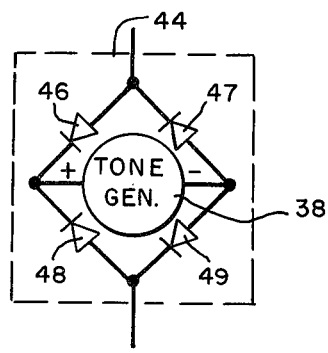
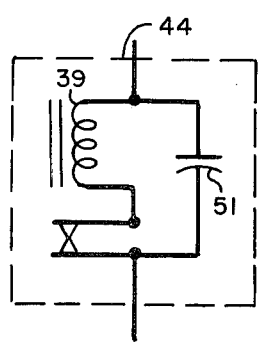
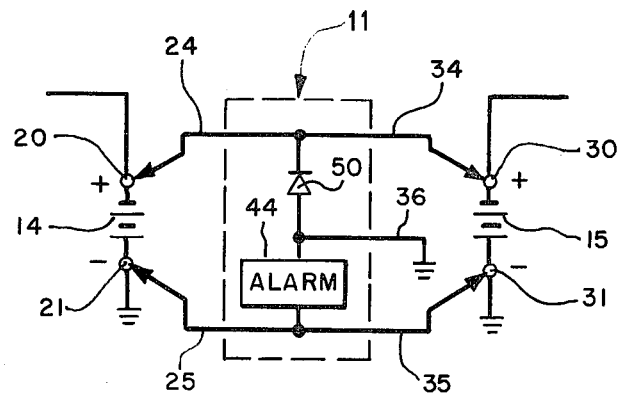
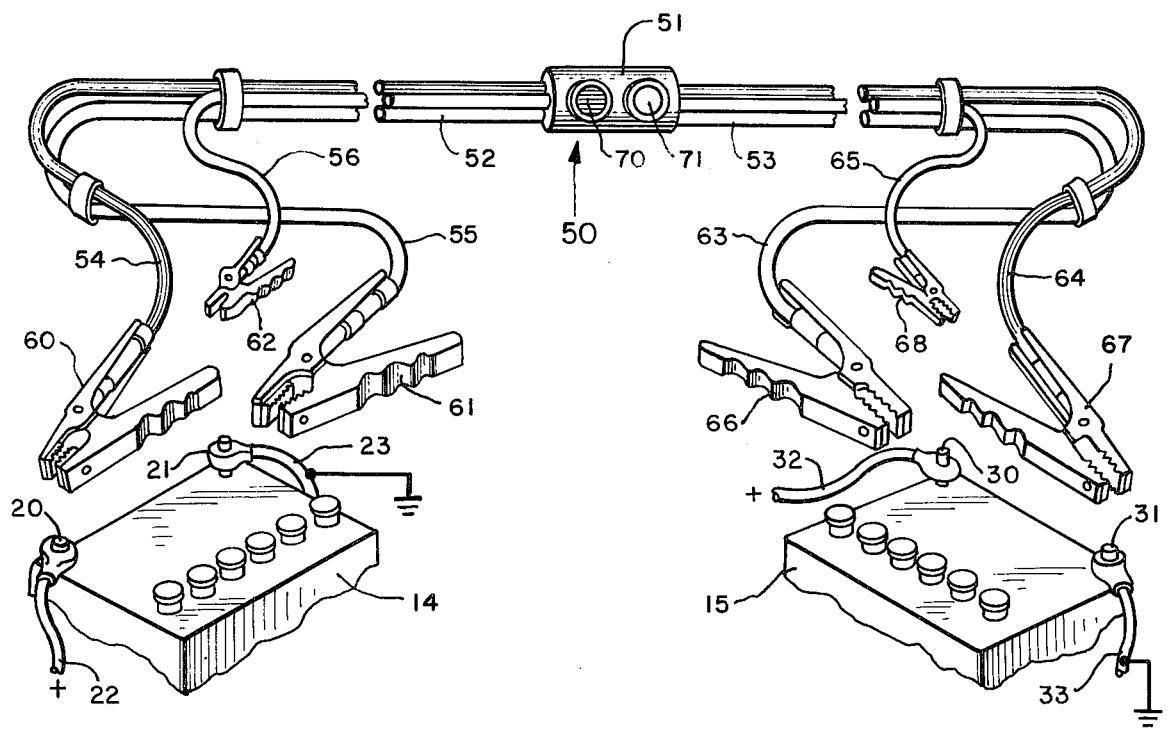

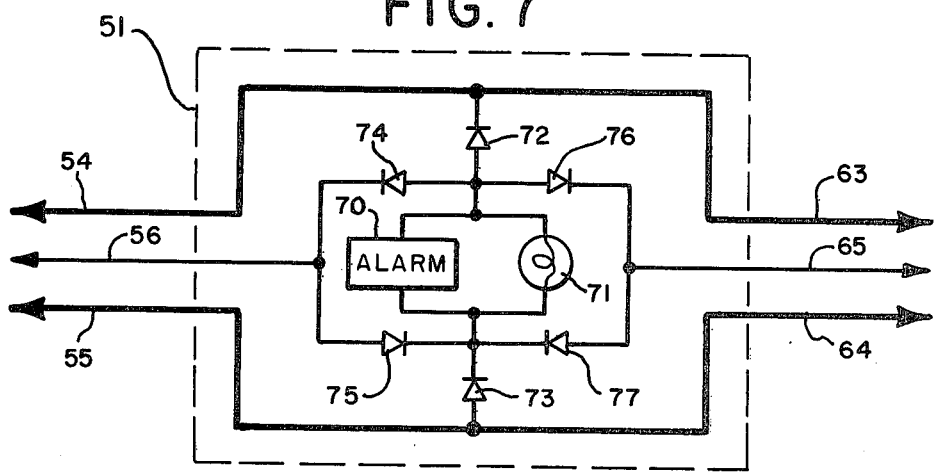
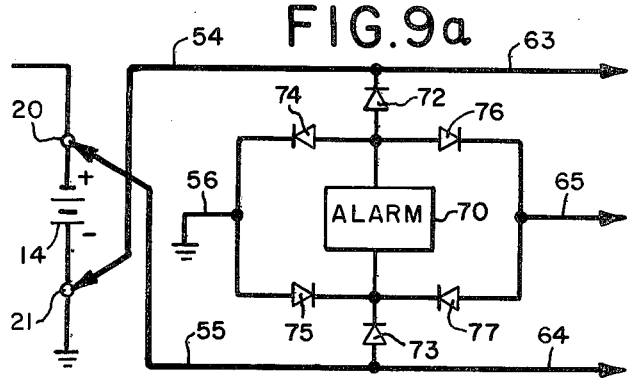
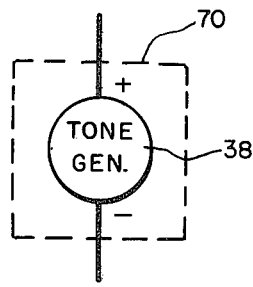
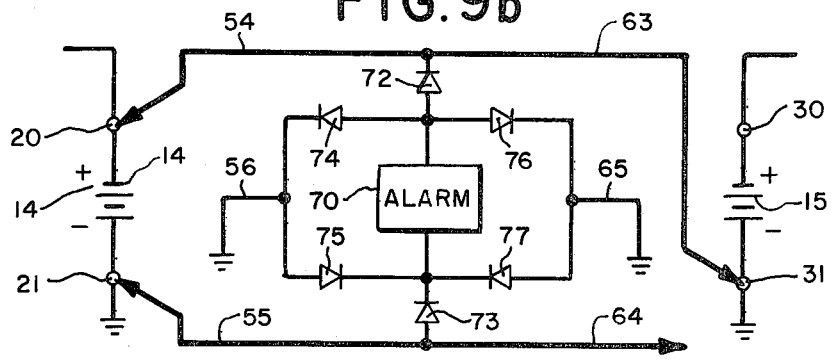
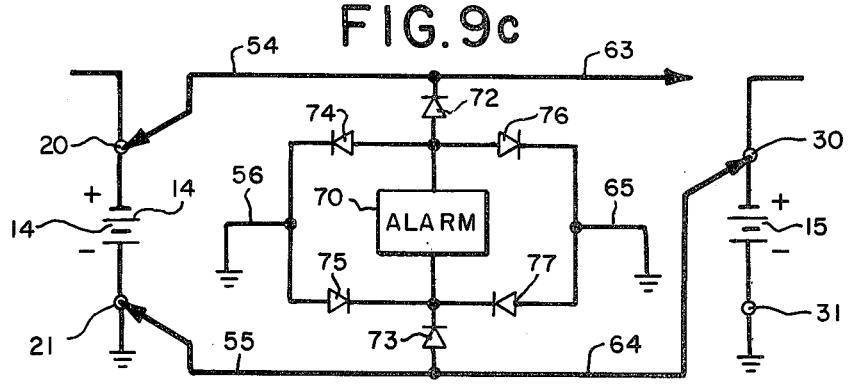

BATTERY JUMPER CABLE SYSTEM

BACKGROUND OF THE INVENTION

The present invention is directed generally to battery jumper cables, and more particularly to battery jumper cable systems which provide protection against inadvertent mis-connection of two batteries.

When the battery of an engine driven vehicle becomes discharged to the point where it provides insufficient current to crank the engine of the vehicle, it is common practice to parallel-connect, or jump, a fully charged donor battery, such as may be present in another engine driven vehicle, to the discharged battery to obtain the requisite cranking power. Jumper cables having heavy gauge conductors fitted with alligator-type clamps at either end are typically utilized for this purpose. When the engine has started, the jumper cable is disconnected and the alternator associated with the engine recharges the depleted battery.

One problem associated with battery jumping operations is maintaining like polarity between the terminals of the interconnected batteries. Should the polarities of the terminals be inadvertently reversed, as by mis-connection of the jumper cable conductors, the batteries are effectively connected in series and short-circuited, so that a heavy current limited only by the resistance of the conductors and the internal impedance of the batteries flows through the batteries and conductors. As a result, the batteries may overheat and explode and the jumper cable may be permanently damaged.

The present invention provides a jumper cable system wherein a signal module is incorporated to warn of a reverse polarity connection. The warning, which may be either audible or visual, or both, is given prior to the batteries being interconnected to preclude any possibility of a short circuit condition.

Accordingly, it is a general object of the present invention to provide a new and improved jumper cable system.

It is a specific object of the present invention to provide a jumper cable system which provides protection against reverse polarity connection of a donor battery and a depleted battery.

It is another specific object of the present invention to provide a jumper cable system which provides an alarm indication upon the conductors thereof being mis-connected to a donor battery or to a depleted battery.

SUMMARY OF THE INVENTION

The invention is directed to a jumper cable system for interconnecting a donor battery and a depleted battery. The system includes a first electrical connector means comprising a first conductor including electric clamp means at either end for connecting a first terminal of the first battery to a first terminal of the second battery, and second electrical connection means comprising a second conductor including electric clamps at either end for connecting the remaining terminal of the first battery to the remaining terminal of the second battery. Signal means connected between the first and second conductors and responsive to the polarity thereof are provided to sound an alarm upon the first conductor having a negative polarity and the second conductor assuming a positive polarity.

BRIEF DESCRIPTION OF THE DRAWINGS

The features of the present invention which are believed to be novel are set forth with particularity in the appended claims. The invention, together with the further objects and advantages thereof, may best be understood by reference to the following description taken in conjunction with the accompanying drawings, in the several figures of which like reference numerals identify like elements, and in which:

FIG. 1 is a perspective view of a jumper cable system constructed in accordance with the invention.

FIG. 2 is a schematic diagram of the jumper cable system of FIG. 1.

FIG. 3 is a schematic diagram of an electronic tone generator for use with the system of FIG. 2.

FIG. 4 is a schematic diagram of a buzzer alarm device for use with the system of FIG. 2.

FIG. 5a is a simplified schematic diagram of the jumper cable system correctly connected to a depleted battery.

FIG. 5b is a simplified schematic diagram showing the jumper cable system mis-connected to a depleted battery and providing an alarm signal indicative of the mis-connection.

FIG. 5c is a simplified schematic diagram of the jumper cable system correctly connected to a depleted battery and having its positive conductor mis-connected to the negative terminal of a donor battery and providing an alarm indicative of the misconnection.

FIG. 5d is a simplified schematic diagram showing the jumper cable system correctly connected to a depleted battery and having its negative conductor mis-connected to the positive terminal of a donor battery and providing an alarm indicative of the misconnection.

FIG. 5e is a simplified schematic diagram of the jumper cable system correctly interconnecting a depleted battery and a donor battery.

FIG. 6 is a perspective view of an alternate construction of the jumper cable system of the invention wherein either end of the cable assembly can be initially connected to either a depleted battery or a donor battery.

FIG. 7 is a simplified schematic diagram of the alternate construction of the jumper cable system shown in FIG. 4.

FIG. 8 is a schematic diagram of an electronic tone generator for use with the alternate system of FIG. 6.

FIG. 9a is a simplified schematic diagram of the alternate construction of the jumper cable system shown correctly interconnected to a depleted battery.

FIG. 9b is a simplified schematic diagram showing the jumper cable system of FIG. 6 correctly connected to a depleted battery and having its positive conductor incorrectly connected to the negative terminal of a donor battery and providing an alarm indicative of misconnection.

FIG. 9c is a simplified schematic diagram of the jumper cable of FIG. 4 correctly connected to a depleted battery and having its negative conductor mis-connected to the positive terminal of a donor battery and providing an alarm indicative of the misconnection.

DESCRIPTION OF THE PREFERRED EMBODIMENT

Referring to the figures, and particularly to FIG. 1, a battery jumper cable system 10 constructed in accordance with the invention is seen to include an alarm module 11, a first cable portion 12 and a second cable portion 13. The first cable portion 12 is intended for connection to a first battery 14, henceforth termed the depleted battery. The second cable portion 13 is intended for connection to a second battery 15, henceforth termed the donor battery.

Batteries 14 and 15 may be conventional lead acid type vehicle batteries such as commonly utilized in automobiles and other vehicles. It will be understood however that the jumper cable system of the invention may be used with other types of batteries as well.

The depleted battery 14 includes, in accordance with conventional practice, a positive terminal post 20 and a negative terminal post 21. These posts may be connected by conventional means such as cables 22 and 23 to the electrical circuitry of the vehicle in which the battery is utilized. In accordance with conventional practice, the cable 23 connected to the negative terminal post 21 is grounded to the vehicle frame.

The first cable portion 12 of the jumper cable system 10 includes a first conductor 24 and a second conductor 25. A pair of spring-loaded clamps 26 and 27 are provided at the ends of conductors 24 and 25 to facilitate connection of the conductors to battery terminal posts 20 and 21, respectively. Clamps 26 and 27 may be conventional in construction and operation, and may include a spring-loaded jaw portion formed of electrically conductive material for engaging the terminal posts, and an insulated handle portion by which the operator can open the jaw portion when making connections.

The donor battery 15, which is also shown as a conventional lead acid vehicle battery, includes terminal posts 30 and 31. A conductor 32 connects the positive terminal post 30 to the electrical system of the vehicle in which the battery is installed. A second conductor 33 connects the negative terminal post 31 to the frame of the vehicle in accordance with conventional practice.

The second cable portion 13 of the jumper cable system 10 includes three conductors 34, 35 and 36 adapted to connect to the positive terminal post 30, the negative terminal post 31 and the vehicle frame, respectively. To this end, these conductors are provided with respective spring-loaded clamps 40, 41 and 42. Clamps 40 and 41, which may be larger than clamp 42, are similar to the previously described clamps 26 and 27. Clamp 42, which may be slightly smaller in size than clamps 40 and 41, is adapted for connection to any convenient point on the frame of the vehicle in which battery 15 is installed.

The alarm module 11, which may be formed with a housing 43 of a hard impact-resistant plastic or rubber material, includes an audible alarm device 44 for signaling by means of a buzz or tone an incorrect battery connection, and a visual indicator 45 in the form of a lamp and protective lens on the module housing for visually indicating an improper connection.

Referring to the schematic diagram shown in FIG. 2, within housing 43 conductor 24 is connected to conductor 34, and conductor 25 is connected to conductor 35. In practice, conductors 24 and 34 and conductors 25 and 35 may be formed as continuous unbroken heavy gauge conductors so as to provide minimal series resistance when interconnecting two batteries.

To provide the desired alarm upon misconnection of the batteries, the aural alarm device 44 is connected through a diode 50 to the juncture of conductors 24 and 34, henceforth collectively termed the positive jumper lead. The remaining terminal of alarm device 44 is connected directly to the juncture of conductors 25 and 35, henceforth termed the negative jumper lead. Diode 50 is poled as shown, so that current will be provided to alarm device 44 only when the positive jumper lead 24, 34 is negative with respect to the negative jumper lead 25, 35.

To provide a visual indication concurrently with the actuation of alarm device 44, the visual indicator 45 may comprise a conventional incandescent lamp connected in parallel with alarm device 44, which may be either an electronic tone generator 38, as shown in FIG. 3, or an interrupted-current type buzzer 39, as shown in FIG. 4. In the event an electronic tone generator is provided, a bridge rectifier network comprising diodes 46–49 provides current flow through the tone generator 39 in a single direction for operation of transistor circuitry. In the event that a buzzer is utilized, the bridge rectifier diodes may not be required and a capacitor 51 may be connected across the device to minimize interference.

Conductor 36, which is connected to the frame of the donor battery vehicle, is connected to the juncture of diode 50 and alarm device 44. As will be seen presently, this enables the jumper system of the invention to provide a warning upon misconnection of battery leads 34 or 35 to the donor battery 15.

Referring to FIG. 5a, the battery cable jumper system 10 is shown properly connected to the depleted battery 14. Since the positive jumper lead 24, 34 is positive relative to the negative battery jumper lead 25, 35, diode 50 is reverse biased and no current flows through alarm device 44. However, if as shown in FIG. 5b leads 24 and 25 are misconnected to depleted battery 14, the positive jumper lead 24, 34 is negative with respect to the negative jumper lead 25, 35, diode 50 is forward biased, and alarm device 44 is actuated.

Thus, if the operator should accidently misconnect leads 24 and 25 to the donor battery upon initial hook up of the jumper cable system, the visual and aural alarms are immediately activated to alert the operator of the misconnection. Consequently, the operator reconnects conductors 24 and 25 prior to proceeding with hooking up the opposite end of the jumper cable system.

Once the depleted battery 14 has been properly connected cable portion 13 is connected to the donor battery 15. The invention provides protection against misconnection of this cable portion. Referring to FIG. 5c, in the event that conductor 34 is misconnected to the negative battery post 31 of donor battery 15, a circuit is formed from battery 14 through the positive battery jumper lead 24, 34, the frame of the receiving battery vehicle, and conductor 36 to alarm device 44. This results in alarm 44 being sounded to immediately alert the operator that lead 34 has been misconnected. Although the depleted battery 14 may be so depleted as to be incapable of adequately cranking an associated engine, it will normally have sufficient current capacity to satisfy the relatively low power requirements of alarm device 44.

In the event that conductor 35 is misconnected to the positive terminal post 30 of battery 15, as shown in FIG. 5d, a circuit is established from battery 15 through alarm device 44 and conductor 36 to sound alarm device 44. This immediately indicates to the operator that the conductor has been misconnected and must be reconnected to the other battery terminal post 31 prior to connecting conductor 34.

In all cases where alarm device 44 is sounded, it will be appreciated that the optional shunt-connected indicator lamp 45 will also light. Also, where it is necessary that alarm device 44 operate in one direction, as in the case of a transistor-type tone generator, it may be necessary to include diodes 46-49, as shown in FIG. 3. In the case of an interrupted-current device, such as a buzzer, the direction of current will ordinarily have no effect, and the diodes are not required.

When the jumper cable system of FIGS. 1 and 2 is properly connected to batteries 14 and 15, as shown in FIG. 5e, no alarm is generated and the batteries are effectively connected in parallel by the positive jumper lead 24, 34 and the negative jumper lead 25, 35.

In further accord with the invention, a jumper cable system 50 may be provided having an alarm module and interchangeable first and second cable portions 52 and 53 for connection to either the depleted battery 14 or the donor battery 15. Referring to FIGS. 6 and 7, in this system the first cable portion 52 is seen to include individual conductors 54, 55 and 56 for connection to the positive polarity battery post 20, the negative polarity battery post 21 and the frame of the vehicle of the depleted battery. These conductors are provided with spring-loaded clamps 60, 61 and 62, which may be similar to previously described clamps 40, 41 and 42, respectively.

The second cable portion 53 comprises individual conductors 63, 64 and 65 for connection to the positive polarity battery post 30, the negative polarity battery post 31, and the frame of the vehicle of the donor battery. These conductors are provided with spring-loaded clamps 66, 67 and 68, which may be similar to previously described clamps 40, 41 and 42, respectively.

Although cable portion 52 is shown connected to the depleted battery 14, this portion of the jumper cable system may instead be connected to the donor battery 15. Similarly, although the second cable portion 53 is shown connected to the donor battery 15, this cable portion may be connected to the depleted battery 14. Thus, the battery jumper cable system of FIG. 4 is universal in that either end may be connected to either the depleted or the donor battery.

Referring to FIG. 7, conductors 54 and 63 are combined within the alarm module 51 to form a single positive jumper lead 54, 63. Similarly, conductors 55 and 64 are combined within module 51 to form a single negative jumper lead 55, 64. Module 51 may include either an aural alarm device 70 or a visual alarm device 71, or both. These devices are connected in parallel and are supplied with operating power by a diode 72 connected between the positive jumper lead 54, 63 and one terminal of each of the parallel-connected devices, and a diode 73 connected between the remaining terminals of the devices and the negative jumper lead 55, 64.

The third conductor 56 of the first cable portion 52 is connected to the juncture of diode 72 and the alarm devices by a diode 74 and to the juncture of diode 73 and the alarm devices by a diode 75. Similarly, conductor 65 of the second cable portion 53 is connected to the juncture of diode 72 and the alarm devices by a diode 76 and to the juncture of diode 73 and the alarm devices by a diode 77. With this arrangement, the alarm devices will be activated upon misconnection of any battery jumper lead to either the donor or the depleted battery. For example, should the depleted battery 14 be misconnected, as shown in FIG. 9a, alarms 70 and 71 will be activated by current flow through diodes 72 and 73 as a result of the positive jumper lead 54, 63 being negative with respect to the negative jumper lead 55, 64.

If the depleted battery 14 is properly connected and the positive battery lead 54, 63 is incorrectly connected to the negative terminal post of the donor battery 15, as shown in FIG. 9b, an alarm is sounded as a consequence of current flow through conductors 54, 63, 65 diode 77, alarm device 70, diode 74 and conductor 56. If the negative battery jumper lead 55, 64 is misconnected to the positive terminal post of the donor battery 15, as shown in FIG. 9c, an alarm is sounded as a consequence of current flow through conductor 64, diode 73, alarm device 70, diode 76 and conductor 65.

Since the circuit is symmetrical with respect to the two cable portions 52 and 53, it follows that the same results will be obtained if the cable is reversed with conductors 63 and 64 connected to depleted battery 14, and conductors 54 and 55 connected to donor battery 15. Thus, it is not necessary for the operator to ascertain a particular connection arrangement in utilizing the jumper cable system of FIG. 4.

Since current flow through the alarm device 70 is always in one direction, the bridge rectifier input arrangement utilized in connection with the electronic tone generator circuit illustrated in FIG. 3 is not required. Consequently, the tone generator 19 illustrated therein may be connected to the juncture of diodes 72, 74 and 76 and to the juncture of diodes 73, 75 and 77, as shown in FIG. 8. The indicator lamp 71 may be connected in parallel with this circuit as previously described.

Thus, a novel battery jumper cable system has been described which provides protection against inadvertent short-circuiting of two parallel-connected batteries. By providing an aural and/or visual alarm upon an initial mis-connection a short circuit condition can never develop. Furthermore, the indication is unambiguous and will be readily apparent even to untrained personnel under adverse conditions.

Although the alarm devices have been shown in the form of tone generators, buzzers and indicator lamps which are activated upon a mis-connection, it will be understood that the alarm function can be provided by devices which activate when the batteries are properly connected. For example, an indicator lamp could be lit upon the correct connection of the first battery, and extinguished by a relay or other means upon misconnection to the second battery. As used herein, the deactivation of an alarm device upon a correct connection being established shall be considered as providing an alarm to the operator.

The jumper cable system of the invention can be economically constructed from readily available components. For example, in a cable intended for use with standard 12 volt batteries the diodes may be conventional 0.5 Amp 400 PIV devices. The indicator lamp may be a 12-14 volt lamp, and the tone generator may be a 12 volt transistorized device having a built-in transducer, such as the Sonalert (Trademark) manufactured by Mallory Corporation. The cable system may be constructed for use with batteries of lower or higher voltages, such as 6 volts or 24 volts, by appropriate substitution of components. Alternatively, a zener-regulator circuit of conventional construction may be provided to supply proper operating voltage to the alarm devices over a wide range of applied battery voltages.

While particular embodiments of the invention have been shown and described, it will be obvious to those skilled in the art that changes and modifications may be made therein without departing from the invention in its broader aspects, and, therefore, the aim in the appended claims is to cover all such changes and modifications as fall within the true spirit and scope of the invention.

I claim:

1. A jumper cable system for interconnecting first and second batteries each having positive and negative polarity terminals, comprising, in combination:

first electrical connector means comprising a first conductor for connecting the positive terminal of the first battery to the positive terminal of the second battery;

second electrical connector means comprising a second conductor for connecting the negative terminal of the first battery to the negative terminal of the second battery; and signaling means including an alarm device and a diode serially connected between said first and second conductors, and a first additional conductor extending between the juncture of said alarm device and said diode and the negative terminal of said second battery, for providing an alarm upon said first conductor being connected to the negative terminal of the first battery and said second conductor being connected to the positive terminal of the first battery, or upon said first conductor being connected to the positive terminal of the first battery and said second conductor being connected to the negative terminal of the second battery, and the other end of said first conductor being connected to the negative terminal of the first battery or the other end of said second conductor being connected to the positive terminal of the second battery.

2. A jumper cable system as defined in claim 1 wherein said first battery is a vehicle battery, and the negative terminal of said first battery is connected to a vehicle frame, and said additional conductor includes clamp means for connecting to said frame.

3. A jumper cable system as defined in claim 1 wherein said diode is connected between siad alarm device and said first conductor, and wherein said signaling means comprise an additional diode like-poled to said first diode and serially connected between said alarm device and said second conductor, and a second additional conductor extending to the negative terminal of the first battery, and wherein said additional conductors are each connected by respective pairs of oppositely poled diodes to the junctures of said first and second diodes and said alarm device.

4. A jumper cable system as defined in claim 3 wherein said first and second batteries are vehicle batteries, and the negative terminals of said batteries are connected to the frames of respective vehicles, and said first and second additional conductors include clamp means for connecting to respective ones of said frames.

5. A jumper cable system for interconnecting first and second batteries each having positive and negative polarity terminals, comprising, in combination:

first electrical connector means comprising a first conductor for connecting the positive terminal of the first battery to the positive terminal of the second battery;

second electrical connector means comprising a second conductor for connecting the negative terminal of the first battery to the negative terminal of the second battery; and signaling means comprising an alarm device and a diode serially connected between said conductors, and a first additional conductor extending between the juncture of said alarm device and said diode and the negative terminal of the second battery, for providing an alarm upon said first conductor being connected to the negative terminal of the first battery and said second conductor being connected to the positive terminal of the first battery, or upon said first conductor being connected to the positive terminal of the first battery and said second conductor being connected to the negative terminal of the second battery, and the other end of said first conductor being connected to the negative terminal of the first battery or the other end of said second conductor being connected to the positive terminal of the second battery.

6. A jumper cable system as defined in claim 5 wherein said first battery is a vehicle battery, and the negative terminal of said first battery is connected to a vehicle frame, and said additional conductor includes clamp means for connecting to said frame.

7. A jumper cable system for interconnecting first and second batteries each having positive and negative polarity terminals, comprising, in combination:

first electrical connector means comprising a first conductor for connecting the positive terminal of the first battery to the positive terminal of the second battery;

second electrical connector means comprising a second conductor for connecting the negative terminal of the first battery to the negative terminal of the second battery; and signaling means comprising an alarm device and first and second diodes serially connected between respective terminals of the alarm device and respective ones of said conductors, and first and second additional conductors extending to the negative terminals of respective ones of the batteries and each connected by respective pairs of oppositely poled diodes to the junctures of said first and second diodes and said alarm device, for providing an alarm upon said first conductor being connected to the negative terminal of one battery and said second conductor being connected to the positive terminal of the one battery, or upon said first conductor being connected to the positive terminal of one battery and said second conductor being connected to the negative terminal of the one battery, and the other end of the first conductor being connected to the negative terminal of the other battery, or the other end of the second conductor being connected to the positive terminal of the other battery.

8. A jumper cable system as defined in claim 7 wherein said first and second batteries are vehicle batteries, and the negative terminals of said batteries are connected to the frames of respective vehicles, and said first and second additional conductors include clamp means for connecting to respective ones of said frames.

* * * * *